(12) United States Patent
Alani et al.

(10) Patent No.: US 7,043,670 B2
(45) Date of Patent: May 9, 2006

(54) REDUCING THE EFFECT OF SIMULTANEOUS SWITCHING NOISE

(75) Inventors: Alaa F. Alani, Hillingdon (GB); Kenneth S. Hunt, Finchampstead (GB)

(73) Assignee: LSI Logic Corporation, Milpitas, CA (US)

(*) Notice: Subject to any disclaimer, the term of this patent is extended or adjusted under 35 U.S.C. 154(b) by 550 days.

(21) Appl. No.: 09/966,327

(22) Filed: Sep. 28, 2001

(65) Prior Publication Data

US 2002/0121918 A1  Sep. 5, 2002

(51) Int. Cl.
*G06F 11/00* (2006.01)

(52) U.S. Cl. .............. 714/47; 326/26; 327/20
(58) Field of Classification Search ......... 714/47; 326/26; 327/20
See application file for complete search history.

(56) References Cited

U.S. PATENT DOCUMENTS

| 4,495,626 | A | | 1/1985 | Brunin et al. ............ 375/19 |
| 4,667,337 | A | | 5/1987 | Fletcher ................. 377/41 |
| 5,534,791 | A | * | 7/1996 | Mattos et al. ........... 326/27 |
| 5,572,145 | A | * | 11/1996 | Kinsella ................ 326/26 |
| 5,748,902 | A | | 5/1998 | Dalton et al. ......... 395/200.76 |
| 5,874,833 | A | | 2/1999 | Perry et al. ............ 326/26 |
| 5,914,618 | A | * | 6/1999 | Mattos ................. 326/87 |
| 5,917,364 | A | | 6/1999 | Nakamura ............. 327/415 |
| 6,072,329 | A | * | 6/2000 | Schenck ............... 326/26 |
| 6,329,834 | B1 | * | 12/2001 | Krasnansky ............ 326/26 |

FOREIGN PATENT DOCUMENTS

| EP | 0886220 | 12/1998 |
| GB | 2341022 | 3/2000 |
| GB | 2345423 | 7/2000 |

OTHER PUBLICATIONS

Microsoft Press Computer Dictionary, 1997, Microsoft Press, Third Edition, p. 66.*

* cited by examiner

*Primary Examiner*—Robert Beausoliel
*Assistant Examiner*—Marc Duncan
(74) *Attorney, Agent, or Firm*—Christopher P Maiorana PC

(57) ABSTRACT

An integrated circuit comprises a microprocessor for generating data signals along a data bus by way of an inverter to a plurality of input/output switching buffers. The buffers pass the data signals to a transmission bus for onward transmission to a receiving integrated circuit. A respective drain and source supply power to the buffers. A transition checking circuit monitors the number of data signals on the data bus simultaneously switching from a first to a second logic state and a control circuit counts the number of the simultaneous switching data signals and generates a flag signal when the count exceeds half the number of buffers. The flag signal is applied to the inverter to invert all of the data signals on the bus.

15 Claims, 4 Drawing Sheets

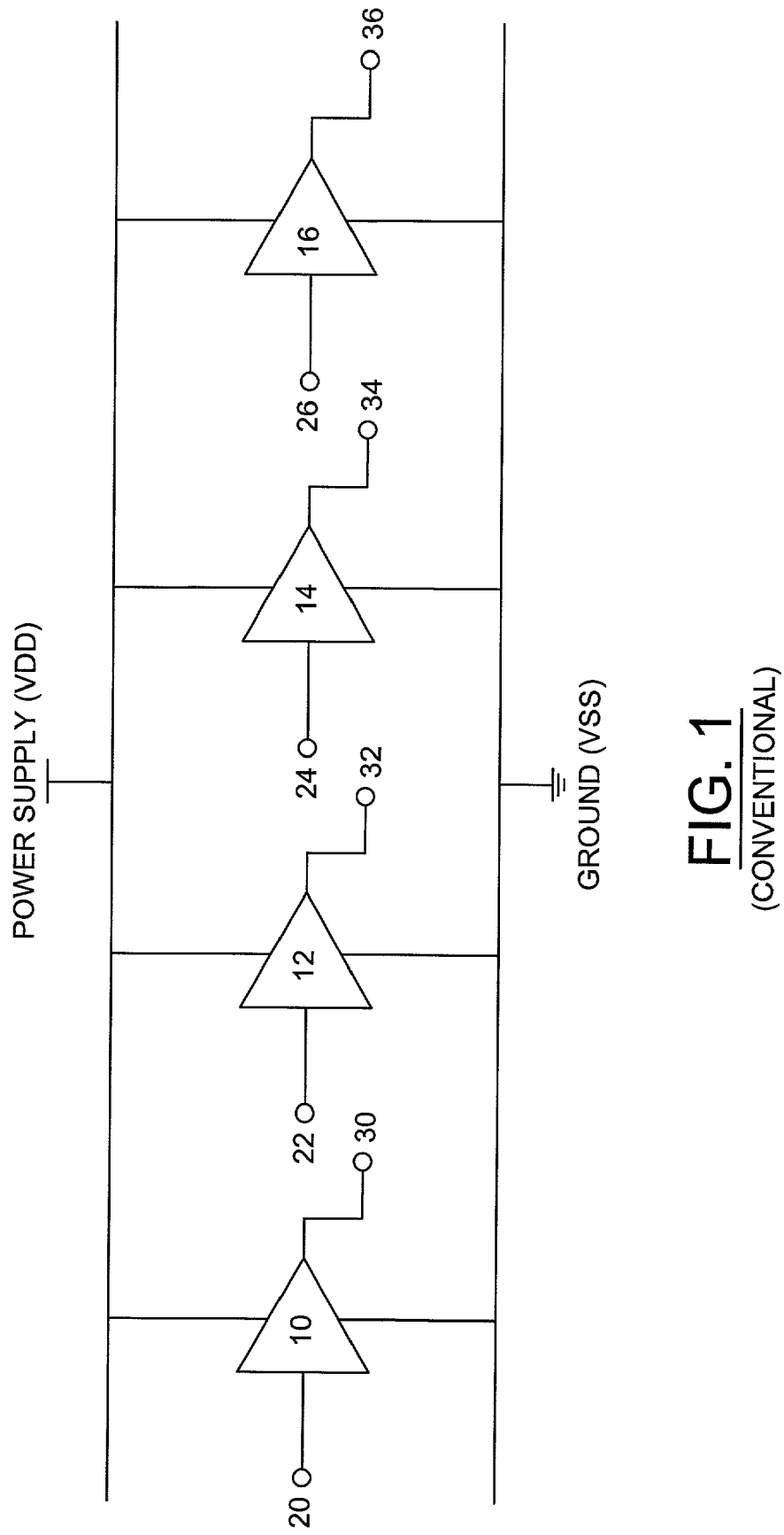
FIG. 1
(CONVENTIONAL)

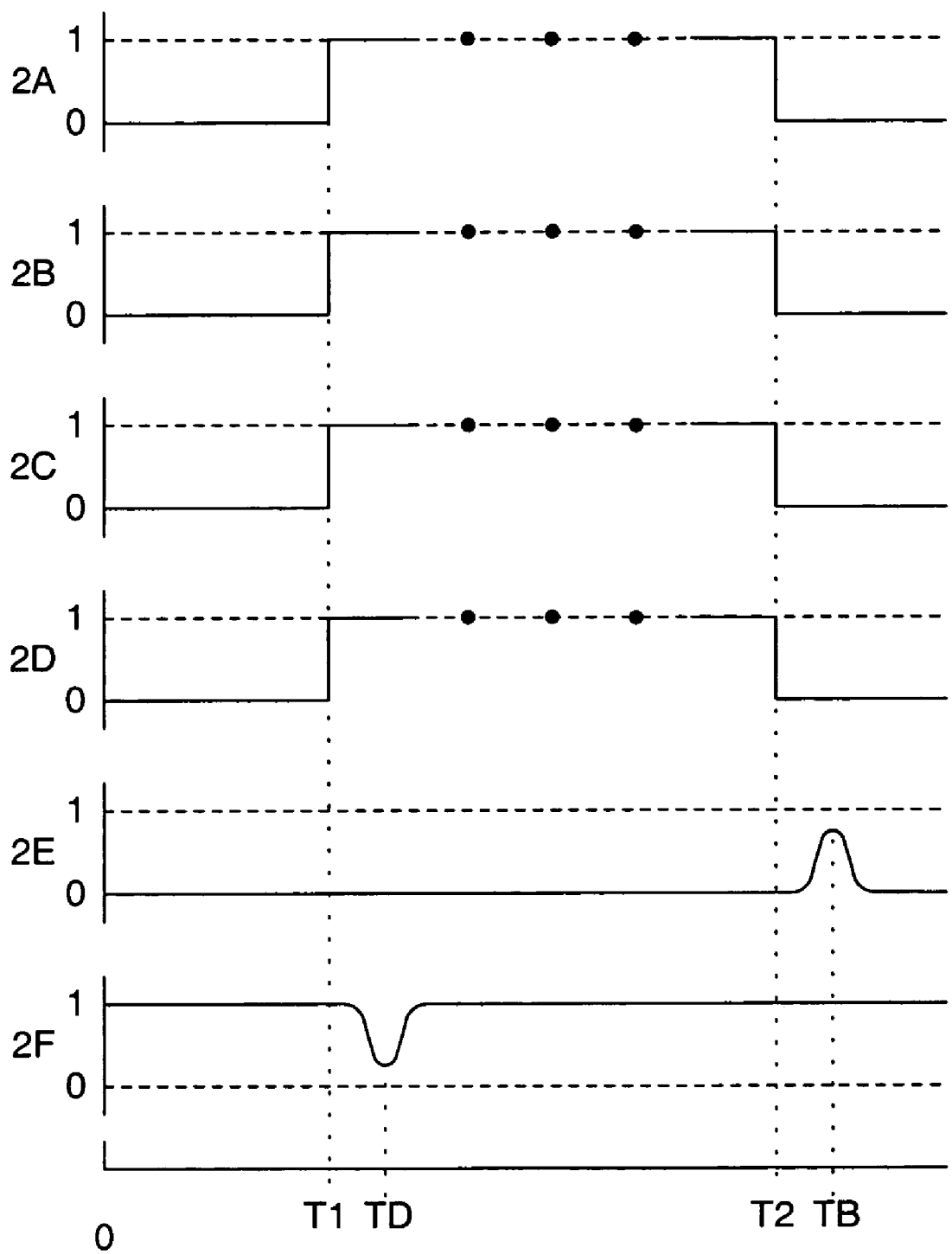
FIG. 2
(CONVENTIONAL)

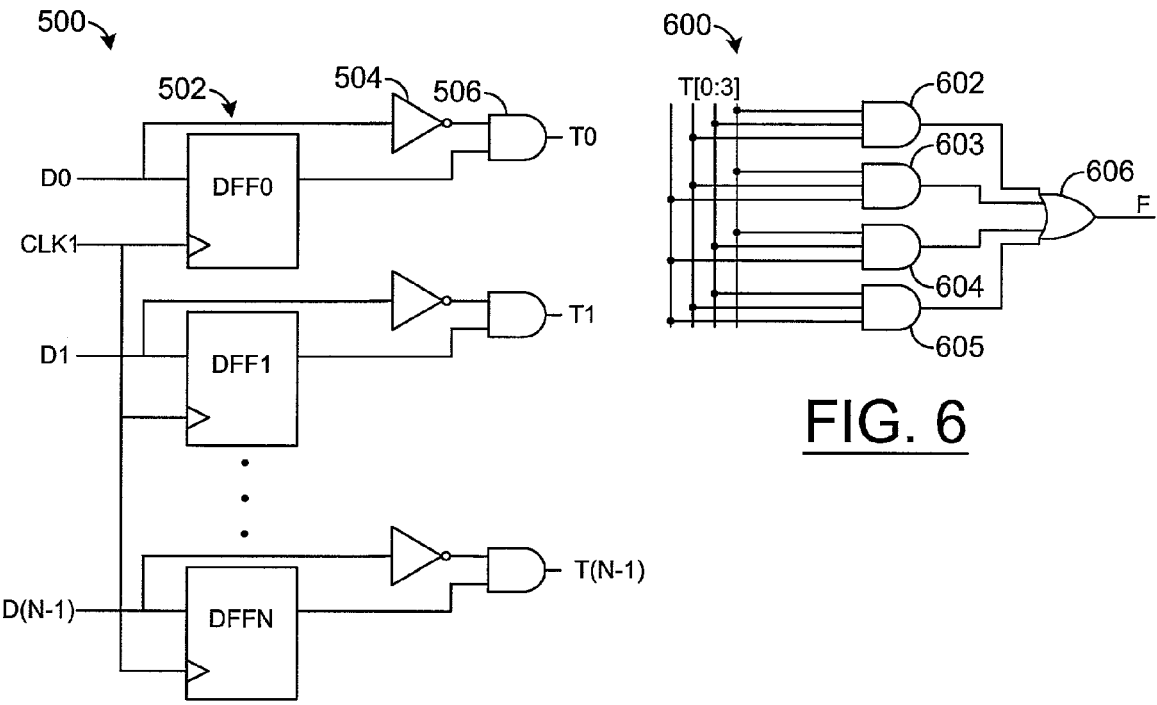
FIG. 5
FIG. 6
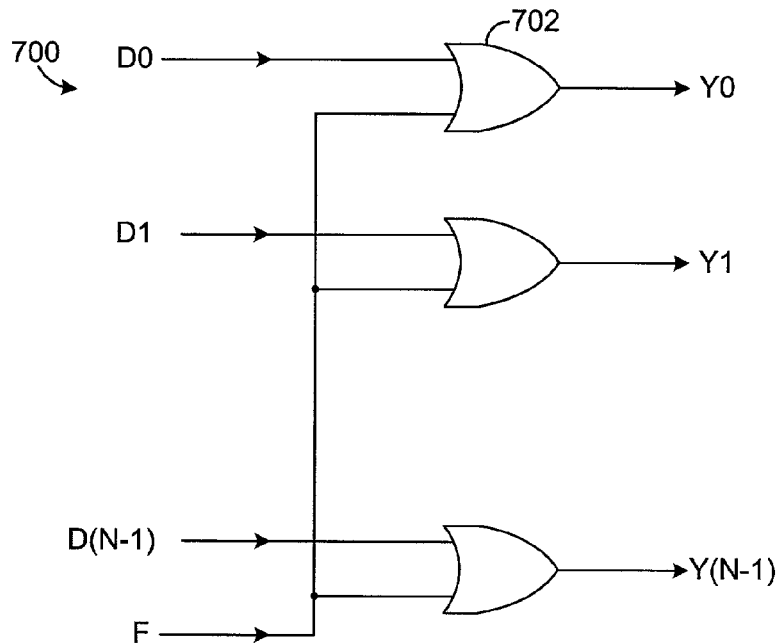
FIG. 7

US 7,043,670 B2

REDUCING THE EFFECT OF SIMULTANEOUS SWITCHING NOISE

This application claims the benefit of United Kingdom Application No. 0024226.3 filed Oct. 4, 2000.

FIELD OF THE INVENTION

The present invention relates to a method and/or architecture for integrated circuit input/output switching generally and, more particularly, to the reduction of the impact of simultaneous switching noise in digital integrated circuits.

BACKGROUND OF THE INVENTION

In a digital integrated circuit (IC), a microprocessor core of the circuit is connected to external pins of the IC through input/output (I/O) switching buffers which pass data from the core of the IC to external pins for transmission via external transmission lines to a receiving IC. The I/O switching buffers need a considerable amount of current in order to drive the high external loads. Power for the I/O switching buffers is provided by way of one or more pairs of supply lines comprising a drain (power) VDD and a source (ground) VSS which are in turn connected to respective external pins of the IC.

A number or array of such I/O switching buffers are commonly connected to the same VDD/VSS pair. However, the data input to some of the I/O switching buffers of the array can switch simultaneously from a logical HIGH state to a logical LOW state (i.e., a H-L transition). Many I/O switching buffers simultaneously performing the H-L transition can give rise to what is known as ground bounce (i.e., a temporary rise in the ground voltage) and thus increased noise. Conversely, the data input to the I/O switching buffers can switch simultaneously from the logical LOW state to the logical HIGH state (i.e., a L-H transition). Several I/O switching buffers simultaneously performing the L-H transition can give rise to what is known as a power droop and thus increased noise. In such circumstances, the ground bounce can also induce a false pulse in an output of an I/O switching buffer which is not switched with the others in the array and whose input switching state is in a "quiet low" condition. Similarly, a false pulse can also be induced in the output of an I/O switching buffer by a power droop when the input of the I/O switching buffer is in a "quiet high" condition. Such false pulses are passed via the transmission lines to the receiving IC which treats the false pulses as true pulses, resulting in a system error.

There are generally three types of I/O switching buffers which are commonly used in ICs. The first is termed an open drain buffer where the drain VDD is not critical and does not give rise to any power droop. In an open drain type of buffer the only concern is for the ground bounce. It will be appreciated that a simultaneously switched output (SSO) number for an open drain buffer refers to the number of I/O switched buffers which can be connected to a common source VSS.

The second type of buffer is termed an open source buffer. In an open source type of buffer the source VSS is not critical and does not give rise to a ground bounce signal. The open source type of buffer is only concerned with power droop. It will be appreciated that the SSO number for an open source buffer refers to the number of buffers which can be connected to a common drain VDD. In the third type of buffer, both the drain VDD and source VSS are of concern and consideration must be given to both power droop and ground bounce.

FIG. 1 shows a conventional array of I/O transistor switching buffers 10, 12, 14 and 16. Each I/O transistor switching buffer 10–16 has a respective input 20, 22, 24, and 26, and an output 30, 32, 34, and 36. Power is supplied via a drain VDD connected to one pin of the IC and a source (ground) VSS connected to a second pin of the IC.

Data signals are applied to the inputs of the buffers 10–16 and then to onward transmission lines (not shown) via the outputs 30–36 of the buffers 10–16. The voltage level at the input 20–26 of each buffer 10–16 would normally be either a "quiet high" (i.e., a logic one state) or a "quiet low" (i.e., a logic zero state).

A number of such buffer circuits 10–16 would be provided in an IC around the periphery to transmit data from the core of the IC to the external connection pins of the circuit for onward transmission to the remote receiving IC. The output 30–36 of each buffer circuit 10–16 is connected to its own external pin of the IC.

FIG. 2 pulse 2A shows a conventional data signal applied, for example, to the input 20 of the buffer circuit 10 to provide an output pulse on the buffer output 30 which would then be applied to the associated external pin of the IC containing the buffer 10. Pulses 2B, 2C and 2D show similar data signals applied to the inputs 22, 24 and 26 of the buffers 12, 14 and 16. If, as is shown in FIG. 2 pulses 2A to 2D, the H-L transitions (i.e., trailing edges) of the data signals coincide and thus the buffers 10 to 16 are switched simultaneously, then a ground bounce (i.e., a rise in the source voltage VSS immediately following the H-L transitions) can occur as shown in pulses 2E. Conversely, if the L-H transitions (i.e., leading edges) of the data signals coincide, then a power droop in the voltage VDD immediately following the L-H transitions can occur as shown in pulse 2F. If the L-H transitions occur a time T1, then the power droop occurs a short time afterwards at time TD. If the H-L transitions occur at a time T2, then the ground bounce occurs a short time afterwards at time TB.

A considerable amount of effort is invested in simultaneous switching output (SSO) analysis for each type of buffer in order to determine the maximum number of simultaneously switching buffers allowed to be connected via a common drain VDD or source VSS to the associated external power or ground pins. The number of switching buffers connected to a common drain VDD and/or source VSS is termed the SSO number and has to be determined during design of the IC. For example, in an eight-bit data bus it is quite possible to have seven I/O buffers switching simultaneously in the same direction (H-L or L-H) and all even buffers can therefore be considered as one SSO group. If the buffers are open drain and analysis has shown that a maximum of four I/O buffers can be connected to a single VSS pin then the SSO number is four and two ground pins will be required for this particular group. Conversely, if the buffers are open source and analysis has shown that a maximum of four I/O buffers can be connected to a single VDD pin then the SSO number is four and two source pins will be required for this particular group.

As will be appreciated, as the number of buffers which can switch simultaneously in the same direction increases, then the number of pairs of power and ground pins required will increase. In the example of FIG. 1, if analysis of the circuit has shown that the four buffers connected to the same VDD/VSS pair results in the ground bounce and/or power droop shown in pulses 2A–2F then more than one pair of power/ground pins would be required for this group. The analysis, in turn, results either in a limitation in the number of pins that can be used for transferring data from the IC or requires an increase in the size of the IC to accommodate the extra pins required.

One way of reducing the impact of simultaneous switching noise or system errors resulting from several buffers switching simultaneously is to stagger the input data transitions slightly in order to break up the SSO groups into smaller groups and reduce the rate of change of the supply current which occurs with simultaneous switching. Staggered input data transitions give rise to a delay in data transfer since delays have to be included in the IC in order to introduce the time variations in the switching pulses. Furthermore, compensating delay has to be introduced further along the transmission line in order to realign the pulses. It is also difficult to predict amount of delay required in order to avoid ground bounce or power droop, particularly when data is transferred at a variable speed. Compensating delay also requires the use of delay lines before the buffer circuits and after the buffer circuits which increases costs. It is also not possible to introduce such a staggered delay for the input switching pulses when processing synchronised signals.

SUMMARY OF THE INVENTION

The present invention is an apparatus generally comprising a circuit and a plurality of buffers. The circuit may be configured to (i) monitor a plurality of signals for transitions and (ii) invert the signals when at least a predetermined number of the signals transition in a predetermined direction. The buffers may be configured to present the signals received from the circuit on a transmission bus.

In one embodiment, the present invention may concern an integrated circuit. The integrated circuit may include a plurality of external pins for connection to external circuitry. A plurality of input/output switching buffers may be provided for receiving respective data signals and passing the data signals to the pins. A respective drain and source generally supply power to the buffers. A data bus may be included for transmitting the data signals to the buffers. Controllable inverters may connect the data bus to the buffers. A monitoring circuit generally (i) monitors the logic state of the data signals on the bus, (ii) counts the number of data signals simultaneously switching from a first to a second logic state and (iii) may cause the controllable inverters to invert all of the data signals on the bus in response to the count exceeding half the number of the buffers. A clock pulse generator may be provided to apply clock pulses to the monitoring circuit.

In one embodiment of the invention, each of the buffers may be an open drain buffer. Furthermore, the monitoring circuit generally monitors the number of simultaneous High to Low transitions of the data signals. The monitoring circuit may control the controllable inverters to invert all of the data signals on the data bus when the number exceeds half the number of the buffers.

The present invention also provides a method of processing data signals generally comprising the steps of generating a group of the data signals from a microprocessor, monitoring the logic state of each of the data signals, counting the number of the data signals in the group simultaneously switching from a first to a second logic state and generating a count thereof, inverting all of the data signals in the group in response to the count exceeding half the number of the data signals in the group, and applying the data signals to a plurality of input/output switching buffers for passing the group of the data signals to a transmission bus.

It will be seen that by monitoring the number of simultaneous H-L transitions which occur at any one time in the data applied to the buffer inputs, and by inverting the data when the number exceeds half the number of data lines, the present invention enables the number of I/O buffer circuits connected to VSS pins to be increased or doubled without violating the SSO rules. For example, if N buffers in an IC were switching simultaneously and the SSO number was N/4, then four VSS pins would be required to avoid high ground bounce that may cause false pulses being transmitted to the receiving IC. By using the present invention only N/2 VSS pins would be required since only up to one half of the data lines are allowed to switch from high to low simultaneously.

The present invention has little impact on data delay and is simple and inexpensive to implement. It requires only a few extra logic gates to be added to an IC in order to double the maximum number of buffers that can be connected to a set of VSS pins. The technique has no impact on the data transfer rate and only introduces a minimal latency of 0.5 clock pulse in the data path. It reduces the effect of simultaneous switching noise based on existing SSO analysis for the buffer/package combination used and helps reduce the power consumption of the output buffers by allowing only less than half the buffers to switch at any transition.

In pad-limited designs, the present invention can have a great advantage particularly when using high current drivers with low SSO numbers. For example, if sixty-four buffers were used to transfer data and the SSO number was eight then a minimum of eight ground pins would be required to prevent ground bounce problems. By using the present invention the SSO can be doubled to sixteen thus reducing the VSS requirements to four pins only. However, this does require an extra pin for the flag signal resulting in a saving of seven pins. Larger savings in VSS pins can be achieved in designs with a larger number of I/O buffers.

The objects, features and advantages of the present invention include providing an improved method and apparatus for integrated circuit input/output switching that may (i) increase the number of buffers connected to a VDD/VSS pair, (ii) cause little impact on data delay, (iii) be inexpensive to implement, (iv) require only a few extra logic gates to be added to an IC, (v) reduce the effect of simultaneous switching noise, and/or (vi) reduce the power consumption of the buffers.

BRIEF DESCRIPTION OF THE DRAWINGS

These and other objects, features and advantages of the present invention will be apparent from the following detailed description and the appended claims and drawings in which:

FIG. 1 is a schematic diagram of a conventional array of input/output switching buffers;

FIG. 2 is a diagram showing the relationship between the input data switching pulses for the I/O buffers of FIG. 1 and power droop and ground bounce pulses;

FIG. 5 is a schematic diagram of a transition checking circuit as used in the SSO doubler of FIG. 4;

FIG. 6 is a schematic diagram of a control circuit of the SSO doubler of FIG. 4; and FIG. 7 is a schematic diagram of a demultiplexer circuit for the receiving integrated circuit of FIG. 3.

DETAILED DESCRIPTION OF THE PREFERRED EMBODIMENTS

In general, ground bounce is more likely to cause a violation of a simultaneously switched output (SSO) number than power droop and thus the following description focuses on reducing the ground bounce in open drain buffers. The same principles may be applied to reducing the power droop in open source buffers. Likewise, the present invention may also be applied to buffers that actively pull high and actively pull low.

Figure 3:
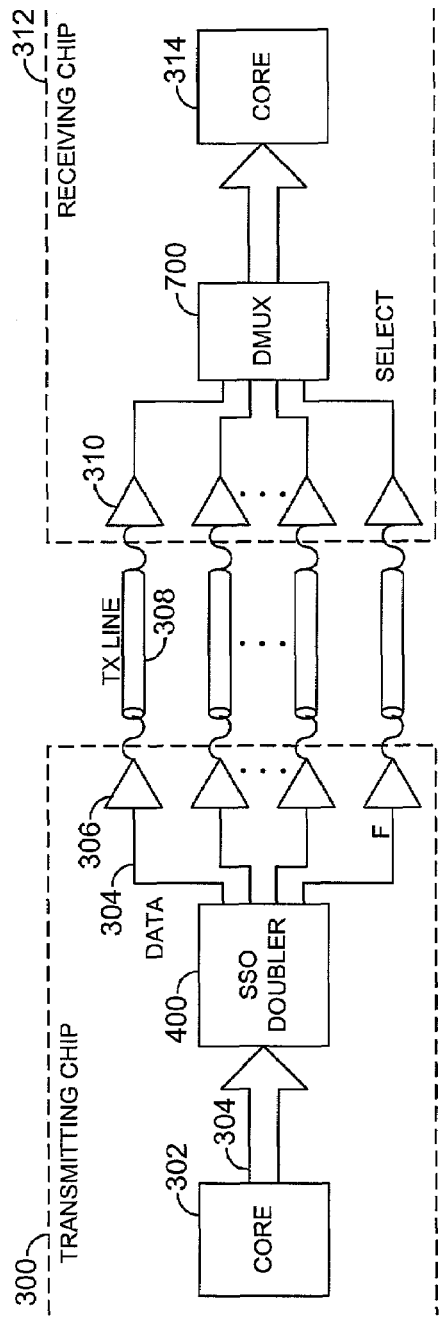
FIG. 3 is a schematic diagram of an integrated circuit according to a preferred embodiment of the present invention, connected through transmission lines to a receiving integrated circuit.

Referring now to FIG. 3, an example system is shown in accordance with a preferred embodiment of the present invention. The system generally includes an apparatus 300 and an apparatus 312 connected by a transmission bus. The apparatus 300 may be implemented as an integrated circuit (IC) having a core 302 with a number (e.g., N) of data lines 304, each numbered 0 to N−1, of a data bus connected to respective inputs of a group of I/O buffers 306 by way of an SSO doubler 400. The I/O buffers 306 may be powered from a single pair of VDD/VSS lines (not shown) connected to a pair of external pins (not shown) of the IC 300. Although only four I/O buffers 306 are shown, it will be appreciated that the number could be greater or less than four. Each of the I/O buffers 306 may have an output connected to a respective pin of the IC which, in turn, may be connected to a respective transmission line 308 of a transmission bus and hence to a respective I/O buffer 310 of the apparatus 312. The apparatus 312 may be implemented as a receiving IC 312. The outputs of the I/O buffers 310 may be connected to a data processing core 314 of the receiving IC 312 by way of a demultiplexer circuit 700.

Figure 4:
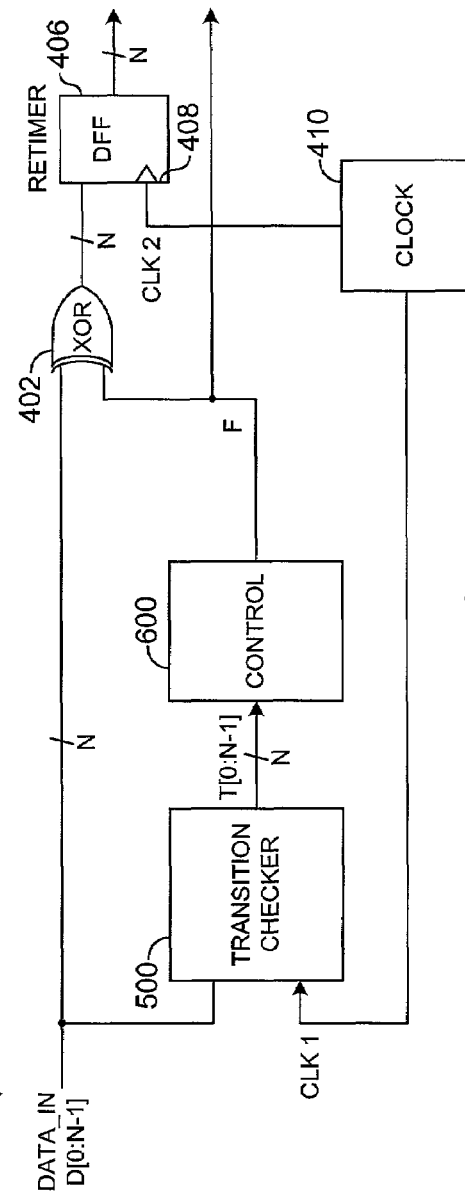
FIG. 4 is a schematic diagram of an SSO doubler of the integrated circuit of FIG. 3.

Referring to FIG. 4, a block diagram of an example implementation of the SSO doubler 400 is shown. The SSO doubler 400 may have a transition checker circuit 500, a control circuit 600, a retimer circuit 406, and a clock generator 410. The SSO doubler 400 may also have an inverter circuit. The inverter circuit may have an array of N logic gates 402. Each logic gate 402 may be implemented as an EXCLUSIVE OR (XOR) gate having two inputs. An input of each logical XOR gate 402 may be connected to receive a control or flag signal (e.g., F) from the control circuit 600. The other input of each logical XOR gate 402 may be connected to a respective data line 304 of the data bus from the core 302 to receive a bit (e.g., D[0:N−1]) of a signal (e.g., DATA_IN). An output of each logical XOR gate 402 may be connected via a further data bus to the retimer circuit 406.

The retimer circuit 406 generally comprises an array of D flip-flops. The output of each logical XOR gate 402 is generally connected to the D input of a respective flip-flop. A clock signal (e.g., CLK2) may be applied from the clock generator 410 to a clock input 408 of the retimer circuit 406. Each flip-flop may be a negative edge triggered flip-flop such that the Q output takes a current state of the D input when a the clock pulse CLK2 transitions from high to low. The retimer circuit 406 generally introduces a latency of a half clock period in the data path. The latency may be necessary to prevent problems which might be caused by skew between the data signals on the data bus and the signal F from the control circuit 600.

The clock generator 410 may also generate and present another clock signal (e.g., CLK1). The clock signal CLK1 may be applied to the transition checker circuit 500. Preferably, the clock signal CLK1 may be the same as the clock signal CLK2. Other relationships between the clock signal CLK1 and the clock signal CLK2 may be implemented to meet the design criteria of a particular application.

Referring to FIG. 5, a block diagram of an example implementation of the transition checker circuit 500 is shown. The transition checker circuit 500 generally comprises an array of D flip-flops 502, each of which has an associated inverter 504 and a logic gate 506. The logic gates 506 may be implemented as logical AND gates. Each data line 304 of the data bus (and thus the signals D[0:N−1]) from the core 302 may be connected to the D input of a respective flip-flop 502 and to an associated inverter 504. The inverters 504 may present an inverted version of the signals D[0:N−1] (e.g., an inverted signal D[0:N−1]) to an input of an associated logical AND gate 506. The Q output of each flip-flop 502 may be connected to the other input of the associated logical AND gate 506 to present a sampled version of the signals D[0:N−1] (e.g., a sampled signal D[0:N−1]). The clock signal CLK1 may be applied from the clock generator 410 to the clock input of each of the flip-flops 502.

The effect of the transition checker circuit 500 is generally to compare previous data input values to the D flip-flops 502 with current data input values for the data signals D[0:N−1] to determine transition directions, if any. With each period of the clock signal CLK1, the current data signal values applied to the D flip-flops 502 may be compared with the previous data stored in the D flip-flops 502. If a previous data value was in a logic one state and a current data value is in a logic zero state, then transition signals (e.g., T0–T(N−1)) generated by the associated logical AND gate 506 may change to the logic one state, otherwise the signal may remains at the logic zero state. As a result, a count of the number of transition signals T[0:N−1] from the logical AND gates 506 that change to the logic one state may be a count of the number of transitions in a predetermined direction (e.g., High to Low) occurring in the data signal D[0:N−1] at any one time. The transition signals T[0:N−1] generated by the logical AND gates 506 of the data transition checker circuit 500 may then be applied to the control unit 600.

Referring to FIG. 6, an example implementation of the control circuit 600 is shown. The example implementation may be for a four-bit bus. Other bus widths may be implemented to meet the design criteria of a particular implementation.

The control circuit 600 generally comprises five logical gates 602, 603, 604, 605 and 606. Each of the logical gates 602, 603, 604 and 605 may be implemented as logical AND gates. The logical gate 606 may be implemented as a logical OR gate. If wider data buses than four bits are used, then additional logical gates may be included. Four unique sets of three data lines from the four-bit bus may be connected to the inputs of the respective logical AND gate 602, 603, 604 and 605 whose outputs are connected to respective inputs of the logical OR gate 606. The output of the logical OR gate 606 may present the flag signal F. The flag signal F may be applied to each of the logical XOR gates 402 of the SSO doubler 400.

Other implementations of the control circuit 600 may by provided to meet the design criteria of a particular application. For example, the control circuit 600 may be implemented as a $2^N$ by 1 read only memory (ROM). The ROM may receive each of the signals T[0:N−1] as an address and present the programmed data as the signal F. The ROM data may be defined to present the signal F in the logical one state for all addresses (e.g., T[0:N−1]) having greater than a predetermined number (e.g.,>50%) of the individual address signals in the logical one state. All other address combinations may be programmed to present the signal F in the logical zero state.

The control circuit 600 generally serves to count the number of simultaneous high to low transitions that are detected by the data transition checker circuit 500 and to generate the flag signal F. The effect of the control circuit 600 may be that if the signals T[0:N−1] presented by the data transition checker circuit 500 indicate that more than 50% of the data signals D[0:N−1] have undergone a simultaneous H-L transition (e.g., a change from the logic one state to the logic zero state) at the same time, then the control circuit 600 may generate and present the flag signal F in the logical one state. The flag signal F may be applied to all of the logical XOR gates 402. The flag signal F in a logical one state may result in all of the data signals D[0:N−1] applied to the logical XOR gates 402 being inverted and then applied via the retimer circuit 406 to the I/O buffers 306. The flag signal F in a logical zero state may result in all of the data signals D[0:N−1] being passed to the retimer circuit 406 non-inverted.

Using FIG. 1 as an example, the effect of the invention may be that if three of the four I/O transistor switching buffers (e.g., 10, 12 and 14) have input data signals which simultaneously switch from High to Low and the fourth I/O transistor switching buffer (e.g., 16) has an input data signal which simultaneously switches from Low to High, then the SSO doubler circuit 400 may invert all of the data at the outputs of the logical XOR gates 402. Thus, the switching data signals actually applied to the inputs of the three I/O transistor switching buffers 10, 12 and 14 may undergo a Low to High transition with only one High to Low transition being applied to the fourth I/O transistor switching buffer 16.

The flag signal F may also be applied by way of an I/O buffer 306 to a demultiplexer circuit 700 of the receiving IC 312. Transmission of the flag signal F to the receiving IC 312 may be necessary in order to inform the receiving IC 312 that the data sent over the transmission lines 308 has been inverted and therefore needs to be reinverted to restore the original data. If there are fewer H-L transitions in the data bus than the SSO number, then the SSO doubler 400 of the present invention has no effect on the data. However, if there are more H-L transitions in the data bus than the SSO number, then all of the data is inverted and the flag signal F is sent to the receiving IC 312 to indicated the transfer of inverted data.

Referring to FIG. 7, a schematic diagram of an example implementation of the demultiplexer 700 is shown. The demultiplexer 700 generally comprises an array of logic gates 702. Each of the logic gates 702 may be implemented as an EXCLUSIVE OR gate. Each logical XOR gate 702 may have an input connected to the output of a respective I/O buffer circuit 310 of IC 312 and a second input connected to receive the flag signal F. While the flag signal F is in the logical one state, then each of the logical XOR gates 702 generally inverts the incoming data which may then be passed to the core 314 of the IC 312. While the flag signal F is in the logical zero state, then each of the logical XOR gates 702 generally passes the incoming data without inverting.

While the above description relates to the reduction of ground bounce in open drain buffers, it will be appreciated that the doubler of the present invention has an equal application in reducing power droop in open source buffers. In this case, the transition checking circuit 500 monitors the low to high transitions and the saving is in VDD pins instead of VSS pins.

The system according to the invention can be used to overcome the problem of ground bounce or power droop depending on the importance/limitations placed on the output buffer technology. For example, with open drain drivers such as NTL/GTL, the high to low transitions are critical but with open source PECL type drivers the low to high transitions are more important. Therefore, the SSO 12 doubler 400 may invert the signals D[0:N−1] when greater than the predetermined number transition from High to Low and when greater than the predetermined number transition from Low to High.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a circuit configured to (i) monitor a plurality of signals for transitions and (ii) invert said signals only when at least a predetermined number of said signals transition to a particular logic state; and
a plurality of buffers configured to present said signals on a transmission bus, wherein said circuit comprises (i) a transition checker circuit directly receiving said signals and configured to present a plurality of transition signals each indicating a transition direction of one of said signals, (ii) a control circuit configured to present a flag signal when at least said predetermined number of said transition signals indicate said transition direction is to said particular logic state and (iii) an inverter circuit configured to invert said signals in response to said flag signal, wherein said transition checker circuit comprises (i) a plurality of flip-flops directly receiving said signals and configured to present said signals as a plurality of sampled signals, (ii) a plurality of inverters configured to present said signals as a plurality of inverted signals, and (iii) a plurality of logic gates configured to present said transition signals in response to said sampled signals and said inverted signals.

2. The apparatus according to claim 1, wherein said particular logic state is one of (i) a high logic state and (ii) a low logic state.

3. The apparatus according to claim 1, wherein said predetermined number is greater than one half of a total number of said signals.

4. The apparatus according to claim 1, wherein said buffers are further configured to present said flag signal on said transmission bus.

5. The apparatus according to claim 1, wherein said circuit further comprises a plurality of first flip-flops configured to store said signals as presented by said inverter circuit.

6. The apparatus according to claim 5, wherein said circuit further comprises a clock configured to present a clock signal to said first flip-flops.

7. The apparatus according to claim 6, wherein said buffers are further configured to present said flag signal on said transmission bus and said transition checker circuit comprises:
a plurality of second flip-flops configured to present said signals as a plurality of sampled signals;

a plurality of inverters configured to present said signals as a plurality of inverted signals; and a plurality of logical gates configured to present said transition signals in response to said sampled signals and said inverted signals.

8. A method of reducing noise induced by transitions of a plurality of signals, the method comprising the steps of:
(A) monitoring said signals for said transitions using a plurality of transition signals on a plurality of independent lines, each of said transition signals indicating a transition direction of one of said signals;
(B) inverting said signals only in response to at least a predetermined number of said signals transitioning to a particular logic state; and
(C) presenting said signals on a transmission bus, wherein step (A) comprises the sub-steps of (i) generating a plurality of transition signals each indicating a transition direction of one of said signals and (ii) generating a flag signal when at least said predetermined number of said transition signals indicate said transition direction is to said particular logic state, wherein generating said plurality of transition signals comprises the sub-steps of (a) sampling said signals to present a plurality of sampled signals, (b) inverting said signals to present a plurality of inverted signals and (c) logically combining said sampled signals and said inverted signals to present said transition signals.

9. The method according to claim 8, wherein said particular logic state is one of (i) a high logic state and (ii) a low logic state.

10. The method according to claim 8, wherein said predetermined number is greater than one half of a total number of said signals.

11. The method according to claim 8, further comprising the step of presenting said flag signal on said transmission bus.

12. The method according to claim 8, further comprising the step of storing said signals prior to presenting said signal on said transmission bus.

13. The method according to claim 12, further comprising the step of generating a clock signal to control said storing.

14. An integrated circuit comprising:

means for monitoring a plurality of signals for transitions comprising means for presenting a plurality of transition signals on a plurality of independent lines, each of said transition signals indicating a transition direction of one of said signals;

means for inverting said signals only in response to at least a predetermined number of said signals transitioning to a particular logic state; and means for presenting said signals on a transmission bus, wherein said means for monitoring comprises (i) generating a plurality of transition signals each indicating a transition direction of one of said signals and (ii) generating a flag signal when at least said predetermined number of said transition signals indicate said transition direction is to said particular logic state, wherein generating said plurality of transition signals comprises the sub-steps of (a) sampling said signals to present a plurality of sampled signals, (b) inverting said signals to present a plurality of inverted signals and (c) logically combining said sampled signals and said inverted signals to present said transition signals.

15. The integrated circuit according to claim 14, wherein said predetermined direction is one of (i) a high to low direction and (ii) a low to high direction.

* * * * *